US010790822B2

(12) United States Patent
Wendt et al.

(10) Patent No.: US 10,790,822 B2
(45) Date of Patent: Sep. 29, 2020

(54) SWITCHING ARRANGEMENT AND METHOD FOR A CAPACITIVE SENSOR

(71) Applicant: IEE International Electronics & Engineering S.A., Echternach (LU)

(72) Inventors: Christoph Wendt, Mettendorf (DE); Laurent Lamesch, Reichlange (LU)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 395 days.

(21) Appl. No.: 15/538,114

(22) PCT Filed: Dec. 30, 2015

(86) PCT No.: PCT/EP2015/081430
§ 371 (c)(1),
(2) Date: Jun. 20, 2017

(87) PCT Pub. No.: WO2016/107910
PCT Pub. Date: Jul. 7, 2016

(65) Prior Publication Data
US 2017/0373686 A1    Dec. 28, 2017

(30) Foreign Application Priority Data
Dec. 31, 2014   (LU) .......................................... 92627

(51) Int. Cl.
*H03K 17/955* (2006.01)
*G01R 27/26* (2006.01)
(Continued)

(52) U.S. Cl.
CPC ....... *H03K 17/955* (2013.01); *G01R 27/2605* (2013.01); *H01H 13/70* (2013.01);
(Continued)

(58) Field of Classification Search
CPC .... H01H 13/70; G01R 27/2605; G06F 3/044; G01D 5/24; H03K 17/955; H03K 17/962;
(Continued)

(56) References Cited

U.S. PATENT DOCUMENTS

| 5,604,685 A | 2/1997 | Seesink et al. |
| 5,973,417 A | 10/1999 | Goetz et al. |

(Continued)

FOREIGN PATENT DOCUMENTS

| CN | 1132349 A | 10/1996 |
| CN | 1535372 A | 10/2004 |

(Continued)

OTHER PUBLICATIONS

International Search Report for International application No. PCT/EP2015/081430, dated May 4, 2016, 3 pages.
(Continued)

*Primary Examiner* — Son T Le
*Assistant Examiner* — Dustin R Dickinson
(74) *Attorney, Agent, or Firm* — Reising Ethington P.C.

(57) ABSTRACT

A capacitive sensor that includes: a sensing electrode having a capacitance to be measured; an alternating voltage source, configured to apply an alternating voltage to the sensing electrode; a capacitive first transfer device; a measurement circuit configured to measure the capacitance of the sensing electrode; and a switching arrangement. The switching arrangement is configured to alternately, in a first switching state, connect the first transfer device to the sensing electrode to enable a charge transfer from the sensing electrode to the first transfer device and, in a second switching state, connect the first transfer device to the measurement circuit to enable a charge transfer from the first transfer device to the measurement circuit.

13 Claims, 2 Drawing Sheets

(51) Int. Cl.
*H01H 13/70* (2006.01)
*H03K 17/96* (2006.01)

(52) U.S. Cl.
CPC . *H03K 17/962* (2013.01); *H03K 2217/96073* (2013.01); *H03K 2217/960705* (2013.01); *H03K 2217/960725* (2013.01)

(58) Field of Classification Search
CPC ........ H03K 2217/960725; H03K 2217/96073; H03K 2217/960705
See application file for complete search history.

(56) References Cited

U.S. PATENT DOCUMENTS

| | | | |
|---|---|---|---|
| 8,570,052 B1 | 10/2013 | Mahartya | |
| 9,494,628 B1* | 11/2016 | Maharyta | ........... G01R 27/2605 |
| 2004/0004488 A1* | 1/2004 | Baxter | ..................... G01D 5/24 |
| | | | 324/678 |
| 2005/0077909 A1 | 4/2005 | Lalla | |
| 2005/0168909 A1* | 8/2005 | Hoekstra | ................ H03K 17/94 |
| | | | 361/271 |
| 2006/0021437 A1 | 2/2006 | Kaduchak et al. | |
| 2012/0043972 A1 | 2/2012 | Jayaraman | |
| 2013/0257786 A1 | 10/2013 | Brown et al. | |
| 2014/0103712 A1* | 4/2014 | Blondin | .................. H02M 7/06 |
| | | | 307/18 |
| 2014/0172336 A1 | 6/2014 | Hourne | |

FOREIGN PATENT DOCUMENTS

| | | |
|---|---|---|
| CN | 103883180 A | 6/2014 |
| CN | 103888128 A | 6/2014 |

OTHER PUBLICATIONS

Written Opinion for International application No. PCT/EP2015/081430, dated May 4, 2016, 6 pages.
English translation of Chinese Office Action corresponding to Chinese Application No. 201580071972.2, dated Jan. 6, 2020, 10 pages.

* cited by examiner

SWITCHING ARRANGEMENT AND METHOD FOR A CAPACITIVE SENSOR

TECHNICAL FIELD

The invention relates to a capacitive sensor and to a method for capacitive sensing.

BACKGROUND ART

Capacitive sensors today are used for a vast variety of applications, like input devices (e.g. touchpads, capacitive sliders, touch wheels, etc.), proximity sensors or occupant detection systems.

A capacitive sensor or capacitive sensing device, called by some electric field sensor or proximity sensor, designates a sensor, which generates a signal responsive to the influence of what is being sensed (a person, a part of a person's body, a pet, an object, etc.) upon an electric field. A capacitive sensor generally comprises at least one antenna electrode, to which is applied an oscillating electric signal and which thereupon emits an electric field into a region of space proximate to the antenna electrode, while the sensor is operating. The sensor comprises at least one sensing electrode at which the influence of an object or living being on the electric field is detected. In some (so-called "loading mode") capacitive occupancy sensors, the one or more antenna electrodes serve at the same time as sensing electrodes. In this case, the measurement circuit determines the current flowing into the one or more antenna electrodes in response to an oscillating voltage being applied to them. The relationship of voltage to current yields the complex impedance between the one or more antenna electrodes and ground. In an alternative version of capacitive sensors ("coupling mode" capacitive sensors), the transmitting antenna electrode(s) and the sensing electrode(s) are separate from one another. In this case, the measurement circuit determines the current or voltage that is induced in the sensing electrode when the transmitting antenna electrode is operating.

While capacitive sensors known in the art are in principle reliable, there is the problem that the sensing electrode is also susceptible to external electric and/or magnetic fields, which can be regarded as "electromagnetic noise". Since the measurement circuit has to be highly sensitive to perform its normal function, it can also be negatively influenced by such EM noise. This may even lead to erroneous detection or non-detection of an object.

SUMMARY

It is thus an object of the present invention to provide means for a more robust capacitive measurement. This problem is solved by a capacitive sensor and method according to the claims.

The invention relates to a capacitive sensor. The application of the inventive sensor is not limited in any way, but it may in particular be used in automotive systems, e.g. as an occupancy sensor for a vehicle seat or for a smart trunk opener.

The sensor comprises a sensing electrode for capacitively coupling to a counterelectrode to form a capacitance to be measured, and an alternating voltage source, which is configured to operatively coupling an alternating voltage to the sensing electrode.

In one embodiment, the counterelectrode is formed by ground and the alternating voltage of said alternating voltage source is applied to the sensing electrode. In this embodiment operating according in the so-called "loading mode", the sensing electrode has a capacitance relative to ground, which is influenced by an object between the sensing electrode and ground. The presence of the object can therefore be detected by the change in capacitance of the sensing electrode.

In a different embodiment, the counterelectrode may be a dedicated transmitting antenna electrode for emitting an alternating electric field in response to an alternating signal from the alternating voltage source applied to said counterelectrode. In this case the alternating voltage is induced in said sensing electrode by said alternating electric field coupling into said sensing electrode. In this embodiment operating according in the so-called "coupling mode", the measurement circuit determines the current or voltage that is induced in the sensing electrode when the transmitting antenna electrode is operating.

The voltage source may be connected directly to the sensing electrode or the transmitting antenna electrode respectively, but there may also be other elements in between. It may also be connected directly or indirectly depending on a switching state of the sensor, as will become clear later. It is preferred that the alternating voltage generated by the alternating voltage source is periodic and thus can be characterized by a (base) frequency. The waveform is in general not limited and may e.g. comprise sinusoidal, triangular, square or rectangular waveforms, although certain waveforms such as are preferred, as will be explained later.

The sensor also comprises a capacitive first transfer device and a measurement circuit configured to measure the capacitance of the sensing electrode. Finally, it comprises a switching arrangement, which is configured to alternately, in a first switching state, connect the first transfer device to the sensing electrode to enable a charge transfer from the sensing electrode to the first transfer device; and, in a second switching state, connect the first transfer device to the measurement circuit to enable a charge transfer from the first transfer device to the measurement circuit.

The first transfer device has a capacitance, which may be the result of one or several capacitive elements being part of the transfer device. In general, the transfer device may also comprise other, non-capacitive elements and of course it may comprise wires, conducting paths, etc for connection purposes.

The switching arrangement normally comprises a plurality of switches, which can be of any suitable type known in the art. In particular, these may be electronic switches, which are controlled by a suitable circuitry to operate synchronously. Even if there is no connection of the individual switches (except for a connection to a common controlled circuitry), they are considered as parts of a single switching arrangement.

The measurement circuit may in principle be a conventional one. It is configured to receive electrical charges (i.e. a current flow) from the first transfer device during the second switching state and uses these electrical charges to measure the capacitance of the sensing electrode. In particular, the measurement circuit may employ an integrating capacitor in combination with a transimpedance amplifier.

An object of the invention is to electrically separate the measurement circuit from the sensing electrode. This is achieved by not transferring electrical charges from the sensing electrode directly to the measurement circuit, but via the first transfer device. The switching arrangement assumes the first and second switching states alternately, i.e. either the connections of the first switching state are established or the connections of the second switching state are established. In the first switching state, the transfer device is connected to the sensing electrode and electrical charges can be transferred from the sensing electrode to the transfer device, i.e. a current flows. In this state, however, the transfer device is not connected to the measurement circuit. Therefore, there is no direct connection between the sensing electrode and the measurement circuit. In the second switching state, the first transfer device is connected to the measurement circuit and electrical charges can be transferred (i.e. a current can flow) to the measurement circuit. In this second switching state, however, the first transfer device is not connected to the sensing electrode and therefore, again, there is no direct connection between the sensing electrode and the measurement circuit.

Therefore, there is at no time a direct connection between the sensing electrode and the measurement circuit. Thus, any electromagnetic noise received by the sensing electrode cannot have an impact on the measurement circuit. The first transfer device works as a protective buffer between the sensing electrode and the measurement circuit. Therefore, the inventive sensor is very robust, even when a sensitive measurement circuit is used, which is susceptible to disturbances from electromagnetic noise. It should also be noted that usually, as will become apparent with the embodiments explained below, the measurement circuit is never connected to the alternating voltage source. In particular, the measurement circuit may always receive a direct voltage, which is easier to handle. It should however be clear that the inventive sensor is not limited to such an embodiment and that other embodiments are also possible.

According to a preferred embodiment, the first transfer device comprises a first transfer capacitor with a first terminal and second terminal, the alternating voltage source is configured to generate an alternating voltage at a first node, and the measurement circuit is connected to a second node and a third node. Moreover, in this embodiment, the switching arrangement is configured to alternately, in the first switching state, connect the first terminal to the sensing electrode and the second terminal to the first node; and in the second switching state, connect the first terminal to the second node and the second terminal to the third node. Here and in the following, "node" refers to a point having a given potential, i.e. if two components are connected to the same node, they are connected to the same potential. This potential, however, may be time-dependent.

It is understood that instead of a single first transfer capacitor, a plurality of capacitors switched in parallel and/or in series could be used. In the embodiment described, the first transfer capacitor and the sensing electrode are connected in series with respect to the alternating voltage source during the first state. During the second switching state, the terminals of the first transfer capacitor are disconnected from the sensing electrode and the alternating voltage source and instead are connected to the measurement circuit via the second and third node. All of the above-mentioned connections are usually direct connections (i.e. without any intermediate elements).

It is also preferred that the measurement circuit comprises an integration capacitor connected to the second node and the third node (i.e. the capacitor has each of its terminals connected to one of these nodes) and a transimpedance amplifier connected to the second node and the third node. Such a configuration is in principle well-known in the art. The integration capacitor usually has a capacitance that is chosen to be much higher than the capacitance of the first transfer device and the expected capacitance of the sensing electrode. The integration capacitor may e.g. have a capacitance with is 100 times larger than expected capacitance of the sensing electrode. Therefore, when the connection between the first transfer device and the measurement circuit is established, the capacitive device(s) of the transfer device will be largely discharged in favor of the integration capacitor.

It is preferred that the alternating voltage source is configured to generate a sinusoidal voltage. While in many common capacitive sensors, a rectangular voltage is used, such a voltage contains, apart from the base frequency, a large amount of higher frequencies, which in turn leads to a considerable amount of radiation. To keep the electromagnetic emissions of the capacitive sensor low, the upper harmonic components should be at least largely eliminated. While in a perfect sine wave, the total harmonic distortion is 0, in a wider sense an alternating voltage may be used that has a total harmonic distortion of less than 5%.

In this context, the switching arrangement may be configured to be in the first switching state when the voltage is rising and is to be in the second switching state when the voltage is dropping. I.e. the switching arrangement is synchronized with the alternating voltage source. Such as synchronization may also be employed in connection with a voltage that is not sinusoidal. If such a non-sinusoidal voltage contains constant portions, the change between the first and second switching state may occur at the start or at the end of such a constant portion.

According to one embodiment, the third node is connected to ground. According to another embodiment, the third node is connected to a constant voltage source. Such a constant voltage source constitutes a bias point for the measurement circuit.

Especially when only a single transfer device is employed, the switching arrangement is preferably configured to connect the sensing electrode to the first node in the second switching state. This means that the sensing electrode will be directly connected to the alternating voltage source during the second switching state. If this is combined with the embodiment where the switching arrangement is synchronized with the alternating voltage source, during the first state, only the sensing electrode is charged by the rising voltage, but in the second switching state, the combination (connection in series) of the sensing electrode and the capacitance of the first transfer device is discharged.

While those embodiments which employ only the first transfer device may be characterized as "asymmetric" with respect to the first and second switching state, there are also embodiments which are more "symmetric". In these embodiments, the capacitive sensor further comprises a capacitive second transfer device and the switching arrangement is further configured to in the first switching state, connect the second transfer device to the measurement circuit to enable a charge transfer from the second transfer device to the measurement circuit, and, in the second switching state, connect the second transfer device to the sensing electrode to enable a charge transfer from the sensing electrode to the second transfer device.

The second transfer device may be designed in the same way as the first transfer device and therefore will not be explained again. In such an embodiment, there is always a charge transfer enabled between the sensing electrode and one (the first/second) transfer device on the one hand and the other (second/first) transfer device and the measurement circuit on the other hand.

In this context, it is preferred that the second transfer device comprises a second transfer capacitor having a third terminal and a fourth terminal and that the switching arrangement is configured to connect the third terminal to the third node and the fourth terminal to the second node in the first state, and connect the third terminal to the sensing electrode and the fourth terminal to the first node in the second switching state. It should be noted that from the point of view of the alternating voltage source, the first and second transfer capacitor are connected antiparallel with respect to the measurement circuit. In other words, when the switching arrangement is synchronized with the alternating voltage source, the first transfer capacitor receives a rising flank of the voltage (first switching state) while the second transfer capacitor receives a falling flank (second switching state). This leads to the two transfer capacitors being charged with opposite polarity. These polarities are rectified by connecting the capacitors in an antiparallel way to the measurement circuit. It should also be noted that due to the antiparallel arrangement, any direct voltage components are cancelled out.

The invention further provides a method for capacitive sensing with a sensing electrode capacitively coupling to a counterelectrode to form a capacitance to be measured, a capacitive first transfer device and a measurement circuit. According to the method, an alternating voltage is operatively coupled to the sensing electrode. Alternately, in a first switching state, the first transfer device is connected to the sensing electrode to enable a charge transfer from the sensing electrode to the first transfer device, and, in a second switching state, the first transfer device is connected to the measurement circuit to enable a charge transfer from the first transfer device to the measurement circuit. Also, the measurement circuit measures the capacitance of the sensing electrode.

It is understood that an alternating voltage source can be employed to apply the alternating voltage and that the switching arrangement can be employed to establish the connections of the first and second switching state.

Preferred embodiments of the inventive methods correspond to those of the inventive capacitive sensor. For sake of brevity, they will therefore not be discussed again.

BRIEF DESCRIPTION OF THE DRAWINGS

Preferred embodiments of the invention will now be described, by way of example, with reference to the accompanying drawings, in which.

DETAILED DESCRIPTION

Figure 1:
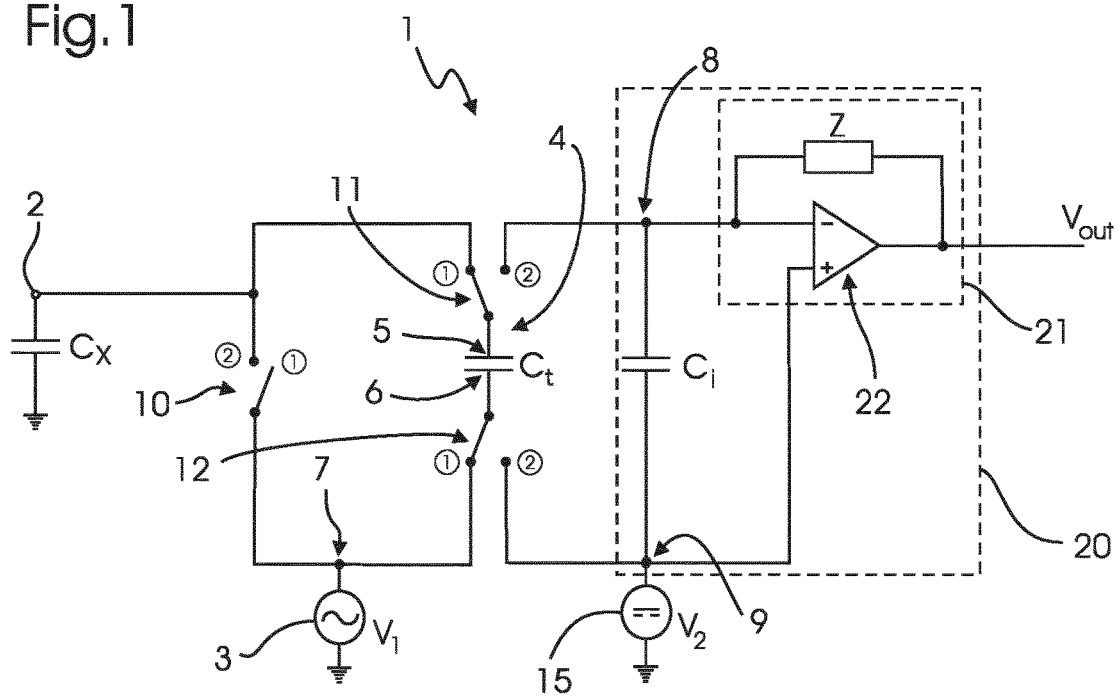
FIG. 1 is a schematic view showing a first embodiment of an inventive capacitive sensor.

FIG. 1 by way of example illustrates a first embodiment of a capacitive sensor 1 according to the invention. The sensor 1 could be arranged in a vehicle seat as an occupancy sensor, in a vehicle bumper as a smart trunk opener, in a handle of a vehicle door as a smart door opener, in a mobile electronic device as part of a touch screen or in other known applications of capacitive sensors. It comprises a sensing electrode 2, which is associated with a capacitance $C_X$ relative to ground. The capacitance $C_X$ is unknown and varies with the presence of an object approaching or touching the sensing electrode 2. The object could be the body of a person, a person's finger or the like.

The sensing electrode 2 is connectable via a first switch 10 to an alternating voltage source 3. The alternating voltage source 3 applies a preferably sinusoidal voltage $V_1$ (shown in FIG. 3) to a first node 7. In a first switching state (indicated by the number 1 in a circle), the first switch 10 is open so that there is no direct connection between the sensing electrode 2 and the alternating voltage source 3. In the second switching state (indicated by the number 2 in a circle), the first switch 10 is closed so that the sensing electrode 2 is connected to the first node 7 and thus to the alternating voltage source 3.

A first transfer capacitor $C_{t1}$ is connected with a first terminal 5 to a second switch 11 and with a second terminal 6 to a third switch 12. The first transfer capacitor $C_{t1}$ basically constitutes a first transfer device 4. In the first switching state, as shown in FIG. 1, the first terminal 5 is connected by the second switch 11 to the sensing electrode 2 and the second terminal 6 is connected by the third switch 12 to the first node 7. In the second switching state, the first terminal 5 is connected to a second node 8 and the second terminal 6 is connected to a third node 9. The second node 8 and the third node are 9 input nodes to a measurement circuit 20, which comprises an integrating capacitor $C_i$ and a transimpedance amplifier 21. The transimpedance amplifier 21 is constructed in a known way using an operation amplifier 22 and an impedance Z, which may be realized by a resistor and a capacitor connected in parallel. The operation amplifier 22 generates at its output a voltage $V_{out}$ which is indicative of the capacitance $C_X$ of the sensing electrode 2.

In the embodiment shown, the third node 9, which is connected to the non-inverting input of the operation amplifier 22, is connected to ground via a direct voltage source 15, which generates a constant voltage $V_2$ as a bias point for the measurement circuit 20. Alternatively, the third node 9 could also be directly connected to ground.

The first, second and third switch 10, 11, 12 are parts of a switching arrangement and change from the first switching state to the second switching state (as indicated in FIG. 1) in a synchronized way. Moreover, they are synchronized to the time evolution of the alternating voltage $V_1$ as indicated by the numbers in FIG. 3. When the voltage $V_1$ is rising, the switching arrangement assumes the first switching state, and when the voltage $V_1$ is dropping, the switching arrangement assumes the second switching state.

In the first switching state, as shown in FIG. 1, the first transfer device 4 is separated from the measurement circuit 20. The first transfer capacitor $C_{t1}$ is connected in series with the unknown capacitance $C_X$, wherefore a current flows between these two elements.

In the second switching state, the first transfer device 4 is disconnected from the alternating voltage source 3 and the sensing electrode 2 and is instead connected to the measurement circuit 20. At this point, the first transfer capacitor $C_{t1}$ has been charged to a certain amount, which depends on the capacitance $C_X$. Since the capacitance of the integrating capacitor $C_i$ is chosen to be much larger than the capacitance of the first transfer capacitor $C_{t1}$, the latter is largely discharged in favor of the integrating capacitor $C_i$. Also in the second switching state, the sensing electrode 2 is connected directly to the alternating voltage source 3 by the first switch 10.

Since the measurement circuit 20 is at no time connected to the sensing electrode 2, it is protected from electromagnetic noise which could be received by the sensing electrode 2. Therefore, the capacitive sensor 1 is relatively robust under electromagnetic compatibility (EMC) aspects. Furthermore, the measurement circuit 20 is at no time exposed to the alternating voltage source 3 and its alternating voltage $V_1$. It rather is only connected to the first transfer capacitor $C_{t1}$, which, for a given capacitance $C_X$, is always charged to a voltage with the same amount and polarity.

Furthermore, since the sensing electrode 2 is only charged with a sinusoidal voltage, which (at least ideally) does not contain any upper harmonics with higher frequencies, its electromagnetic emissions are largely reduced with respect to e.g. a rectangular voltage.

Figure 2:
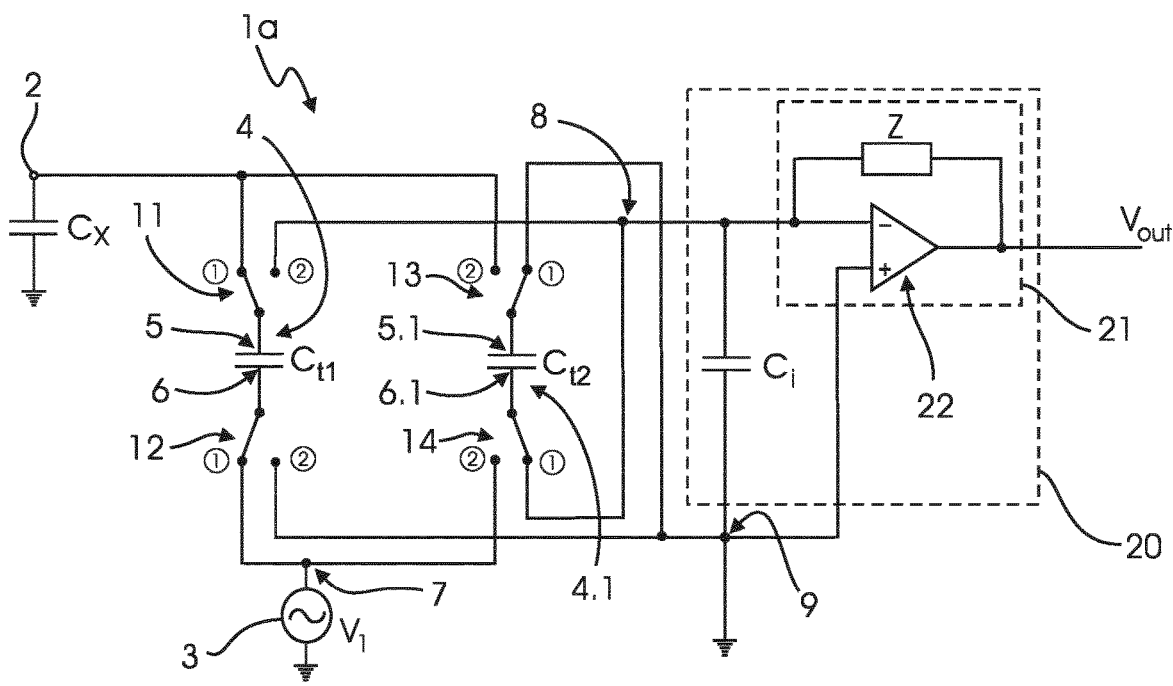
FIG. 2 is a schematic view showing a second embodiment of an inventive capacitive sensor.

FIG. 2 shows a second embodiment of an inventive capacitive sensor 1*a*, which also comprises a sensing electrode 2, an alternating voltage source 3 and a measurement circuit 20. These components are identical to the embodiment shown in FIG. 1 and therefore will not be described again.

Again, a first transfer capacitor $C_{t1}$ of a first transfer device 4 is connected between two switches 11, 12, by which, in a first switching state, a first terminal 5 of the capacitor $C_{t1}$ is connected to the sensing electrode 2 and a second terminal 6 is connected to the first node 7 connected to the alternating voltage source 3. In the second switching state, the first terminal 5 is connected to the second node 8 and the second terminal 6 is connected to the third node 9. Like in FIG. 1, the second node 8 is connected to the inverting input terminal of the operation amplifier 22 and the third node 9 is connected to the non-inverting input terminal. Unlike FIG. 1, the third node 9 is directly connected to ground.

The sensor 1*a* further comprises a second transfer device 4.1, which comprises a second transfer capacitor $C_{t2}$ having a third terminal 5.1 and a fourth terminal 6.1, which are connected to two additional switches 13, 14. In the first switching state, as shown in FIG. 2, the third terminal 5.1 is connected to the third node 9 and the fourth terminal 6.1 is connected to the second node 8. In the second switching state, the third terminal 5.1 is connected to the sensing electrode 2 while the fourth terminal 6.1 is connected to the first node 7 and the alternating voltage source 3.

Figure 3:
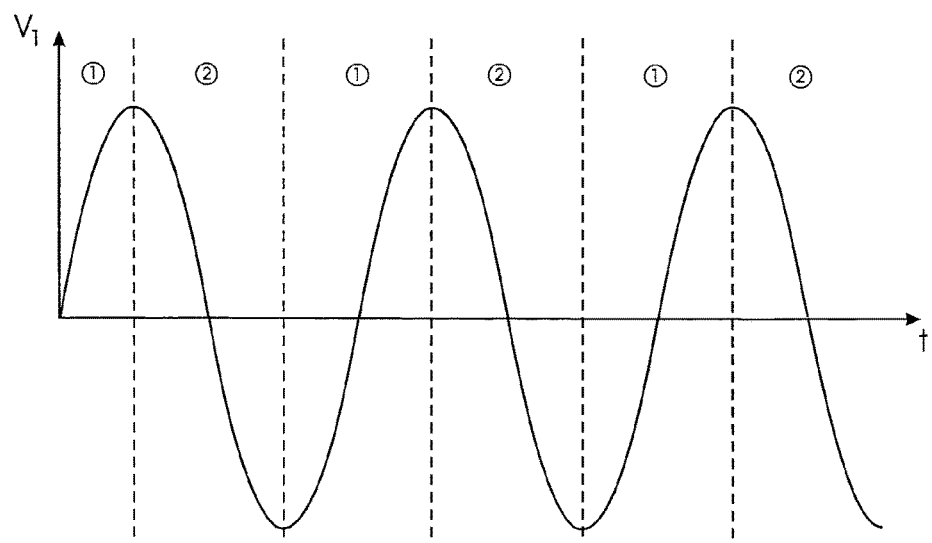
FIG. 3 is a diagram showing a time evolution of an alternating voltage.

In this embodiment, too, the switches 11, 12, 13, 14 are part of the switching arrangement, which is synchronized with the alternating voltage $V_1$ in the way indicated by the numbers in FIG. 3. In the first switching state, the first transfer device 4 is connected to the sensing electrode 2 and the alternating voltage source 3. In this state, the alternating voltage $V_1$ is rising, which means that the first transfer capacitor $C_{t1}$ and the capacitance $C_X$ are both charged by a positive current. At the same time, the second transfer capacitor $C_{t2}$ is disconnected from the sensing electrode 2 and the alternating voltage source 3, but connected to the second and third node 8, 9, which are input nodes to the measurement circuit 20. The transfer capacitors $C_{t1}$, $C_{t2}$ have equal capacitance and the integrating capacitor $C_i$ has a capacitance that is much larger. Therefore, in the first switching states, the second transfer capacitor $C_{t2}$ is discharged in favor of the integrating capacitor $C_i$.

In the second switching state, when the voltage $V_1$ is dropping, the first transfer capacitor $C_{t1}$ is disconnected from the voltage source 3 and the sensing electrode 2 and is instead connected to the second and third node 8, 9. The second transfer capacitor $C_{t2}$, on the other hand, is disconnected from the second and third node 8, 9 and is instead connected between the alternating voltage source 3 and the sensing electrode 2. Now the capacitance $C_X$ and the transfer capacitor $C_{t2}$ are subjected to a negative current, wherefore the second transfer capacitor $C_{t2}$ is charged with a polarity that is opposite to that of the first transfer capacitor $C_{t1}$ in the first switching state. Since, however, the terminals 5.1, 6.1 of the second transfer capacitor $C_{t2}$ are connected to the second node 8 and the third node 9 in an opposite way with respect to the terminals 5, 6 of the first transfer capacitor $C_{t1}$, the integrating capacitor $C_i$ is charged with the same polarity in both switching states.

It should be noted that in the second embodiment, both the rising flank as well as the falling flank of the voltage $V_1$ are used to charge one of the transfer capacitors $C_{t1}$, $C_{t2}$, both of which are used to charge the integrating capacitor $C_i$. Therefore, the sensitivity of the capacitive sensor 1*a* according to the second embodiment is approximately twice as high as in the first embodiment. Like in the first embodiment, the measurement circuit 20 is at no time connected to the sensing electrode 2, wherefore it is protected from electromagnetic noise which could be received by the sensing electrode 2.

The embodiments of the invention shown in FIGS. 1 to 3 all relate to a capacitive sensor operating in the so-called "loading mode". It should however be noted that the principle of the invention applies mutatis mutandis also to a capacitive sensor operating in "coupling mode".

Figure 4:
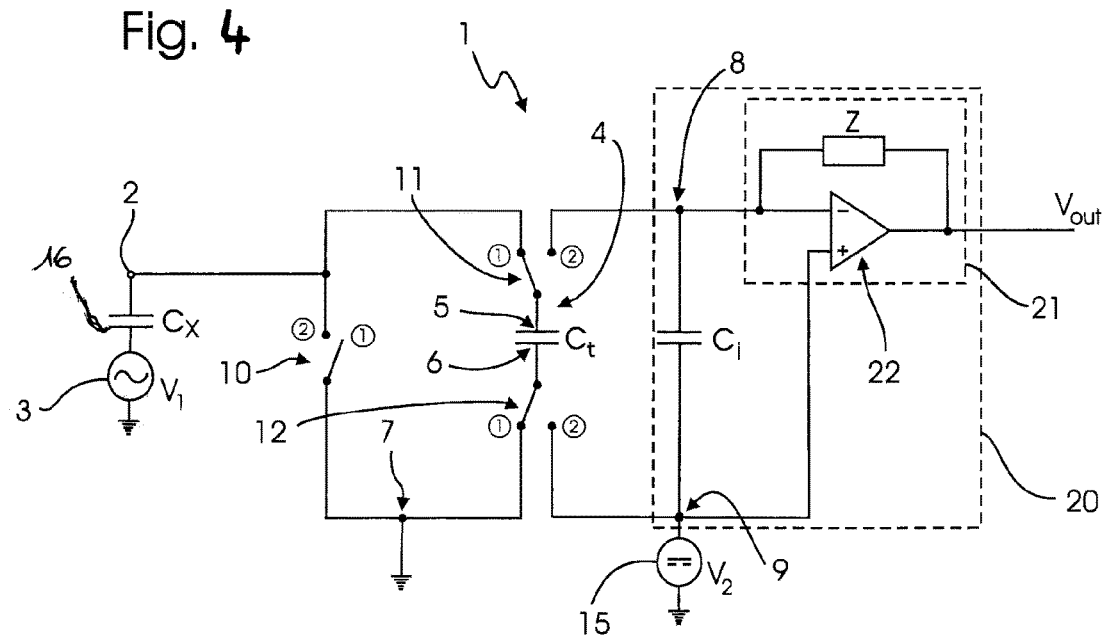
FIG. 4 is a schematic view showing a third embodiment of an inventive capacitive sensor.

FIG. 4 shows an embodiment of a capacitive sensor in "coupling mode", which is similar to the embodiment shown in FIG. 1. In the embodiment shown in FIG. 4, the counterelectrode is a dedicated transmitter electrode 16 and the capacitance to be determined $C_x$ is formed between the sensing electrode 2 and a dedicated transmitter electrode 16. The alternative voltage source 3 is in this embodiment coupled to the antenna electrode 16, while node 7 is coupled to ground. In operation, the transmitting antenna electrode 16 emits an alternating electric field in response to the alternating signal from the alternating voltage source 3 applied to said antenna electrode 16. In this case an alternating voltage is induced in said sensing electrode 2 by said alternating electric field coupling into said sensing electrode 2. In this embodiment, the measurement circuit determines the current or voltage that is induced in the sensing electrode when the transmitting antenna electrode is operating.

It should be noted that the operating of the coupling mode sensor of FIG. 4 with respect to the charge transfer is similar to the loading mode sensor of FIG. 1. It will however be appreciated, that the switching cycles will be inverted with respect to the time evolution of an alternating voltage of FIG. 3. It will finally be appreciated that the the coupling mode sensor could also be provided with a second transfer device in analogy to the embodiment of FIG. 2.

The invention claimed is:

1. A capacitive sensor comprising:
    a sensing electrode for capacitively coupling to a counterelectrode to form a capacitance to be measured;
    an alternating voltage source, configured to operatively couple an alternating voltage to the sensing electrode;
    a capacitive first transfer device;
    a measurement circuit configured to measure the capacitance; and
    a switching arrangement configured to alternately
        in a first switching state, connect the first transfer device to the sensing electrode to enable a charge transfer from the sensing electrode to the first transfer device, while the first transfer device is not connected to the measurement circuit; and in a second switching state, connect the first transfer device to the measurement circuit to enable a charge transfer from the first transfer device to the measurement circuit, while the first transfer device is not connected to the sensing electrode, so that the measurement circuit is at no time connected to the sensing electrode.

2. A capacitive sensor according to claim 1, wherein the first transfer device comprises a first transfer capacitor with a first terminal and second terminal;

the alternating voltage source is configured to generate an alternating voltage at a first node;

the measurement circuit is connected to a second node and a third node; and the switching arrangement is configured to alternately in the first switching state, connect the first terminal to the sensing electrode and the second terminal to the first node; and in the second switching state, connect the first terminal to the second node and the second terminal to the third node.

3. A capacitive sensor according to claim 2, wherein the measurement circuit comprises an integration capacitor connected to the second node and the third node; and a transimpedance amplifier connected to the second node and the third node.

4. A capacitive sensor according to claim 2, wherein the third node is connected to ground.

5. A capacitive sensor according to claim 2, wherein the third node is connected to a constant voltage source.

6. A capacitive sensor according to claim 2, wherein the switching arrangement is configured to connect the sensing electrode to the first node in the second switching state.

7. A capacitive sensor according to claim 2, further comprising a capacitive second transfer device, wherein the second transfer device comprises a second transfer capacitor having a third terminal and a fourth terminal and that the switching arrangement is configured to connect the third terminal to the third node and the fourth terminal to the second node in the first state; and connect the third terminal to the sensing electrode and the fourth terminal to the first node in the second switching state.

8. A capacitive sensor according to claim 1, wherein the alternating voltage source is configured to generate a sinusoidal voltage.

9. A capacitive sensor according to claim 8, wherein the switching arrangement is configured to be in the first switching state when the voltage is rising and is to be in the second switching state when the voltage is dropping.

10. A capacitive sensor according to claim 1, further comprising a capacitive second transfer device and that the switching arrangement is further configured to in the first switching state, connect the second transfer device to the measurement circuit to enable a charge transfer from the second transfer device to the measurement circuit; and in the second switching state, connect the second transfer device to the sensing electrode to enable a charge transfer from the sensing electrode to the second transfer device.

11. A capacitive sensor according to claim 1, wherein said counterelectrode is formed by ground and wherein said alternating voltage ($V_1$) of said alternating voltage source is applied to said sensing electrode.

12. A capacitive sensor according to claim 1, wherein said counterelectrode is a transmitting antenna electrode for emitting an alternating electric field in response to an alternating signal from said alternating voltage source applied to said counterelectrode, and wherein said alternating voltage is induced in said sensing electrode by said alternating electric field coupling into said sensing electrode.

13. Method for capacitive sensing with a sensing electrode capacitively coupling to a counterelectrode to form a capacitance to be measured, a capacitive first transfer device and a measurement circuit, the method comprising:

operatively coupling an alternating voltage to the sensing electrode;

alternately in a first switching state, connecting the first transfer device to the sensing electrode to enable a charge transfer from the sensing electrode to the first transfer device, while the first transfer device is not connected to the measurement circuit; and in a second switching state, connecting the first transfer device to the measurement circuit to enable a charge transfer from the first transfer device to the measurement circuit, while the first transfer device is not connected to the sensing electrode;

so that the measurement circuit is at no time connected to the sensing electrode; and measuring the capacitance of the sensing electrode with the measurement circuit.

* * * * *